(12) United States Patent
Van Pelt (10) Patent No.: US 11,495,267 B2
(45) Date of Patent: Nov. 8, 2022

(54) DATA STORAGE RETAINER SYSTEMS, METHODS, AND DEVICES

(71) Applicant: Seagate Technology LLC, Cupertino, CA (US)

(72) Inventor: Kevin L. Van Pelt, Longmont, CO (US)

(73) Assignee: Seagate Technology LLC, Fremont, CA (US)

( * ) Notice: Subject to any disclaimer, the term of this patent is extended or adjusted under 35 U.S.C. 154(b) by 641 days.

(21) Appl. No.: 16/549,064

(22) Filed: Aug. 23, 2019

(65) Prior Publication Data

US 2021/0057000 A1 Feb. 25, 2021

(51) Int. Cl.
*H05K 7/14* (2006.01)
*H05K 7/20* (2006.01)
*G11B 33/02* (2006.01)

(52) U.S. Cl.
CPC .......... *G11B 33/022* (2013.01); *H05K 7/1411* (2013.01); *H05K 7/1439* (2013.01); *H05K 7/1489* (2013.01); *H05K 7/20736* (2013.01)

(58) Field of Classification Search
CPC .. H05K 7/1411; H05K 7/1439; H05K 7/1489; H05K 7/20736; G06F 1/187; G06F 1/184; G06F 1/181; G06F 1/18; G06F 1/20; G06F 1/182; G06F 1/183; G06F 1/185
See application file for complete search history.

(56) References Cited

U.S. PATENT DOCUMENTS

| | | | | |
|---|---|---|---|---|
| 5,424,916 A * | 6/1995 | Martin | ............... | H05K 7/20636 361/698 |
| 5,506,751 A * | 4/1996 | Chatel | ................. | H05K 7/1418 361/802 |
| 6,654,240 B1 * | 11/2003 | Tseng | ...................... | G06F 1/184 361/679.33 |
| 6,801,427 B2 * | 10/2004 | Gan | ........................ | G06F 1/187 312/307 |
| 7,142,419 B2 * | 11/2006 | Cochrane | ................ | G06F 1/184 |
| 7,289,317 B2 * | 10/2007 | Hood | ...................... | G06F 1/187 361/679.33 |
| 7,660,107 B2 | 2/2010 | Leung | | |
| 7,701,705 B1 | 4/2010 | Szeremeta | | |
| 7,703,291 B2 | 4/2010 | Bushnik et al. | | |
| 8,289,696 B2 * | 10/2012 | Peng | ...................... | G06F 1/187 361/727 |
| 8,477,498 B2 * | 7/2013 | Porreca | ................ | H05K 7/1404 361/708 |
| 8,714,666 B2 * | 5/2014 | Nagahori | ........... | H05K 7/20563 312/236 |
| 9,474,190 B1 * | 10/2016 | Beall | ................... | H05K 7/20736 |
| 9,867,306 B2 * | 1/2018 | Cheng | ................. | H05K 7/1435 |
| 10,986,740 B2 * | 4/2021 | Oh | ........................ | H05K 5/0217 |

(Continued)

*Primary Examiner* — Abhishek M Rathod
(74) *Attorney, Agent, or Firm* — Faegre Drinker Biddle & Reath LLP (57) ABSTRACT

A retention assembly includes a first retention member with a first set of ribs and a second set of ribs. The first set of ribs are positioned to form slots, which are shaped to receive data storage devices. The first set of ribs are arranged to separate adjacent data storage devices and have a first length. The second set of ribs extend into respective slots to form air channels within the slots, and the second set of ribs have a second length that is shorter than the first length.

18 Claims, 7 Drawing Sheets

(56) References Cited

U.S. PATENT DOCUMENTS

| | | | |
|---|---|---|---|
| 2004/0246674 A1* | 12/2004 | Chen | G06F 1/187 |
| | | | 361/679.31 |
| 2006/0018094 A1* | 1/2006 | Robbins | H05K 7/20563 |
| | | | 361/679.48 |
| 2007/0076356 A1* | 4/2007 | Chiang | H05K 5/0213 |
| | | | 361/678 |
| 2007/0211423 A1* | 9/2007 | Huang | G06F 1/187 |
| 2007/0247805 A1 | 10/2007 | Fujie et al. | |
| 2014/0268539 A1* | 9/2014 | Vega | G06F 1/187 |
| | | | 361/679.37 |
| 2015/0036287 A1* | 2/2015 | Ross | G06F 1/20 |
| | | | 361/679.48 |
| 2016/0299541 A1* | 10/2016 | Carota | G06F 1/183 |
| 2017/0265335 A1 | 9/2017 | Szeremeta et al. | |
| 2017/0364128 A1* | 12/2017 | Schroeder | G06F 1/20 |
| 2019/0132996 A1* | 5/2019 | Skoglund | H05K 7/20745 |

* cited by examiner

DATA STORAGE RETAINER SYSTEMS, METHODS, AND DEVICES

SUMMARY

In certain embodiments, a retention assembly includes a first retention member with a first set of ribs and a second set of ribs. The first set of ribs is positioned to form slots, which are shaped to receive data storage devices. The first set of ribs is arranged to separate adjacent data storage devices and has a first length. The second set of ribs extends into respective slots to form air channels within the slots, and the second set of ribs has a second length that is shorter than the first length.

In certain embodiments, a system includes an enclosure with a plurality of walls and includes a retention assembly positioned within the enclosure. The retention assembly includes a housing, data storage devices, and a first retention member. The first retention member includes a first set of ribs and a second set of ribs. The first set of ribs is positioned to form slots in which the data storage devices are positioned and is arranged to separate adjacent data storage devices. The second set of ribs extend into respective slots to form air channels between the data storage devices and the first retention member.

In certain embodiments, a method includes pulling an extractor tool at least partially through an extractor slot away from a first retention member. The method further includes decoupling a data storage device from an electrical connector and at least partially pulling the data storage device out from the retention assembly.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

Data storage systems are used to store and process vast amounts of data. It can be challenging to keep the systems and their components within a desired temperature range because of the amount of heat the systems typically generate during operation. For example, data storage devices within data storage systems generate heat during operation as do the power supply units that power the data storage devices. Data storage systems can include cooling devices such as air movers (e.g., fans) that assist with keeping the systems within the desired temperature range during operation. However, data storage devices in such systems are typically enclosed within carriers, which limit how much surface area of the data storage devices is exposed to air flow and which can have thermal insulator properties. Limiting exposure to air flow can affect the performance of the data storage devices and/or require more powerful and efficient cooling systems. In addition to temperature effects, performance of data storage devices can also be affected by vibration. Certain embodiments of the present disclosure feature retention assemblies that improve cooling and vibration dampening for data storage devices positioned within data storage systems.

Figure 1:
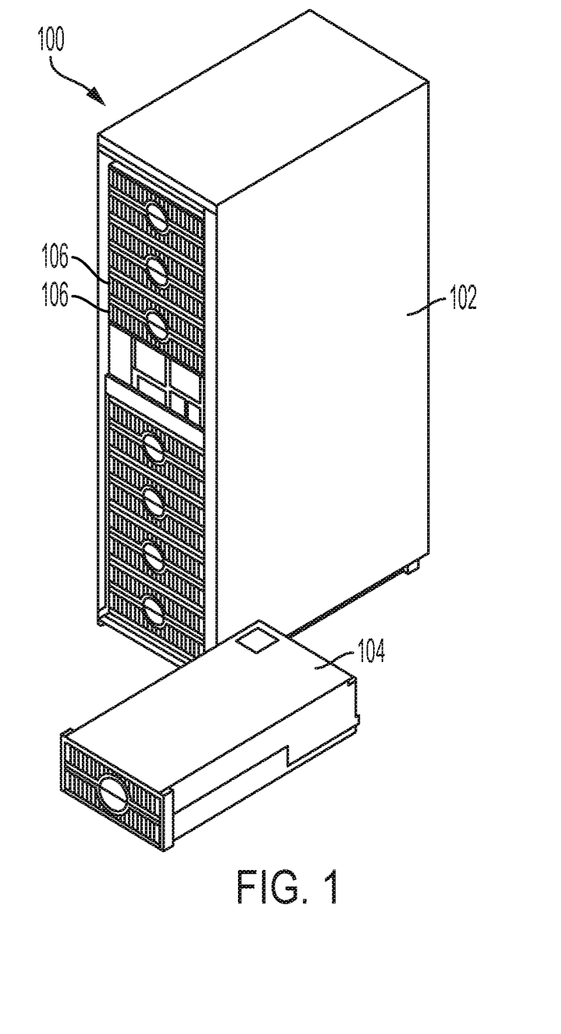
FIG. 1 shows a perspective view of a storage system, in accordance with certain embodiments of the present disclosure.

FIG. 1 shows a data storage system 100 including a rack 102 (e.g., a cabinet) with a plurality of enclosures 104. Each enclosure 104 can include multiple drawers or storage levels 106 that house electronic devices such as data storage devices installed within the drawers or storage levels 106. Each enclosure 104 itself can be arranged in a drawer-like fashion to slide into and out of the rack 102, although the enclosures 104 are not necessarily arranged as such.

Figure 2:
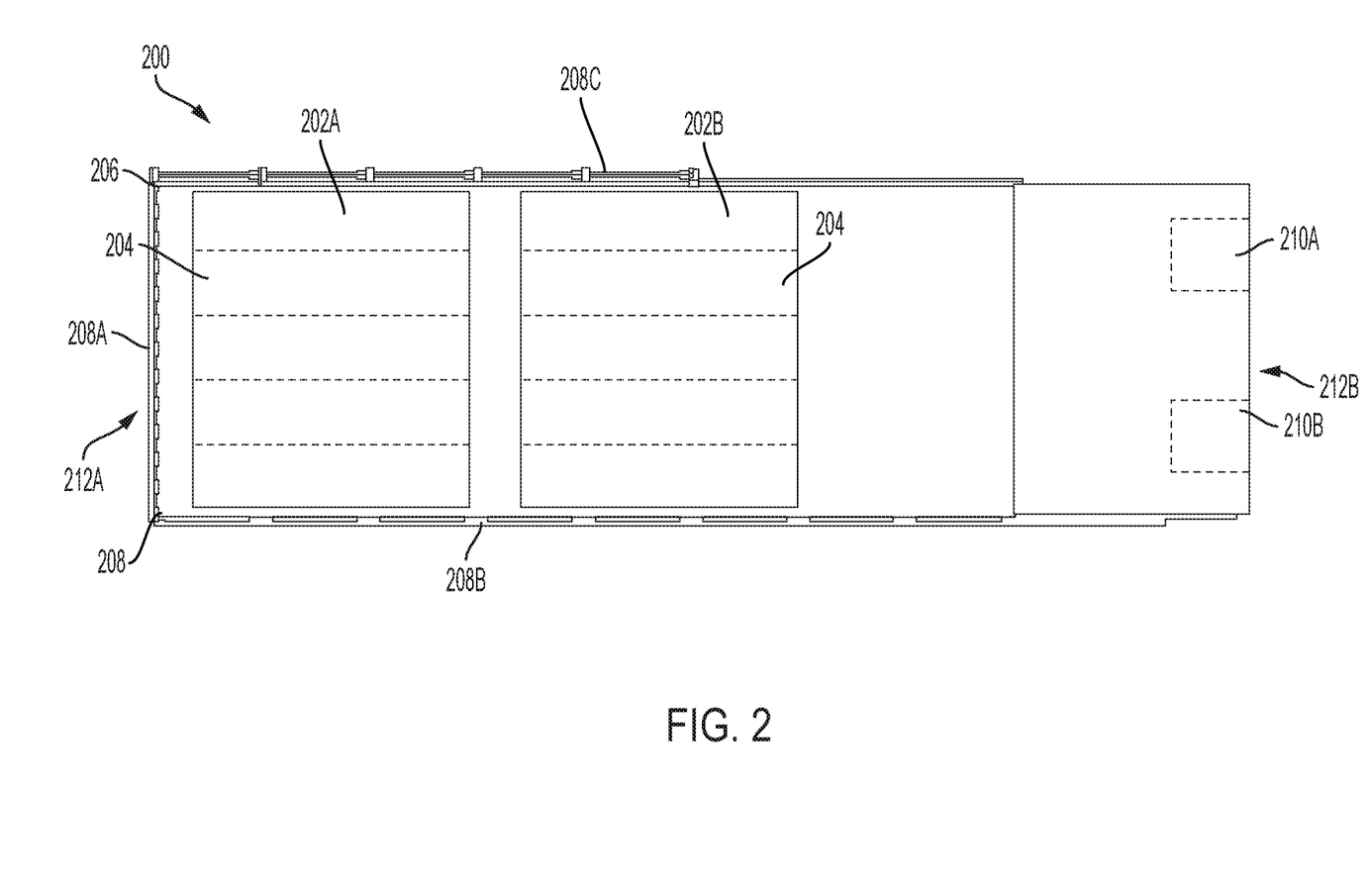
FIG. 2 shows a top view of an enclosure, in accordance with certain embodiments of the present disclosure.

FIG. 2 shows a top view of an enclosure 200, which can be utilized in a data storage system such as the data storage system 100 of FIG. 1. For example, a rack—such as the rack 102 in FIG. 1—can include multiple individual enclosures, such as the enclosure 200. The enclosure 200 includes at least one retention assembly (e.g., a first retention assembly 202A and a second retention assembly 202B). The retention assemblies 202A and 202B are positioned within the enclosure 200 and retain data storage devices 204 (e.g., hard disc drives and/or solid state drives). As will be described in more detail below with respect to FIGS. 3-7, the retention assemblies 202A and 202B are arranged to allow air to cool the data storage devices 204 and to reduce the amount of vibration transferred to and among the data storage devices 204. Although the data storage devices 204 are shown in the figures as being oriented such that the longitudinal axes of the data storage devices 204 are aligned with a longitudinal axis of the enclosure 200 (e.g., also aligned lengthwise with the sidewalls of the chassis), the data storage devices 204 can be oriented in a "tombstone" arrangement where the longitudinal axes are perpendicular to the longitudinal axis of the enclosure 200.

The enclosure 200 includes a chassis 206, the exterior of which includes a front side wall 208A, first side wall 208B, a second side wall 208C, a bottom wall (not shown), and a top cover (not shown). When assembled, the chassis 206 houses and supports the retention assemblies 202A and 202B (and therefore the data storage devices 204), cooling devices 210A and 210B which are hereinafter referred to as air movers (e.g., fan modules), and various other electrical components such as power supply units, wiring, and circuit boards (not shown in FIG. 2). The air movers 210A and 210B draw air from a front end 212A of the enclosure 200 towards a back end 212B of the enclosure 200 and then move the air out of the enclosure 200.

FIGS. 3-7 show various aspects of a retention assembly 300, which can be incorporated into an enclosure and data storage system such as the enclosure 200 of FIG. 2 and the data storage system 100 of FIG. 1.

Figure 3:
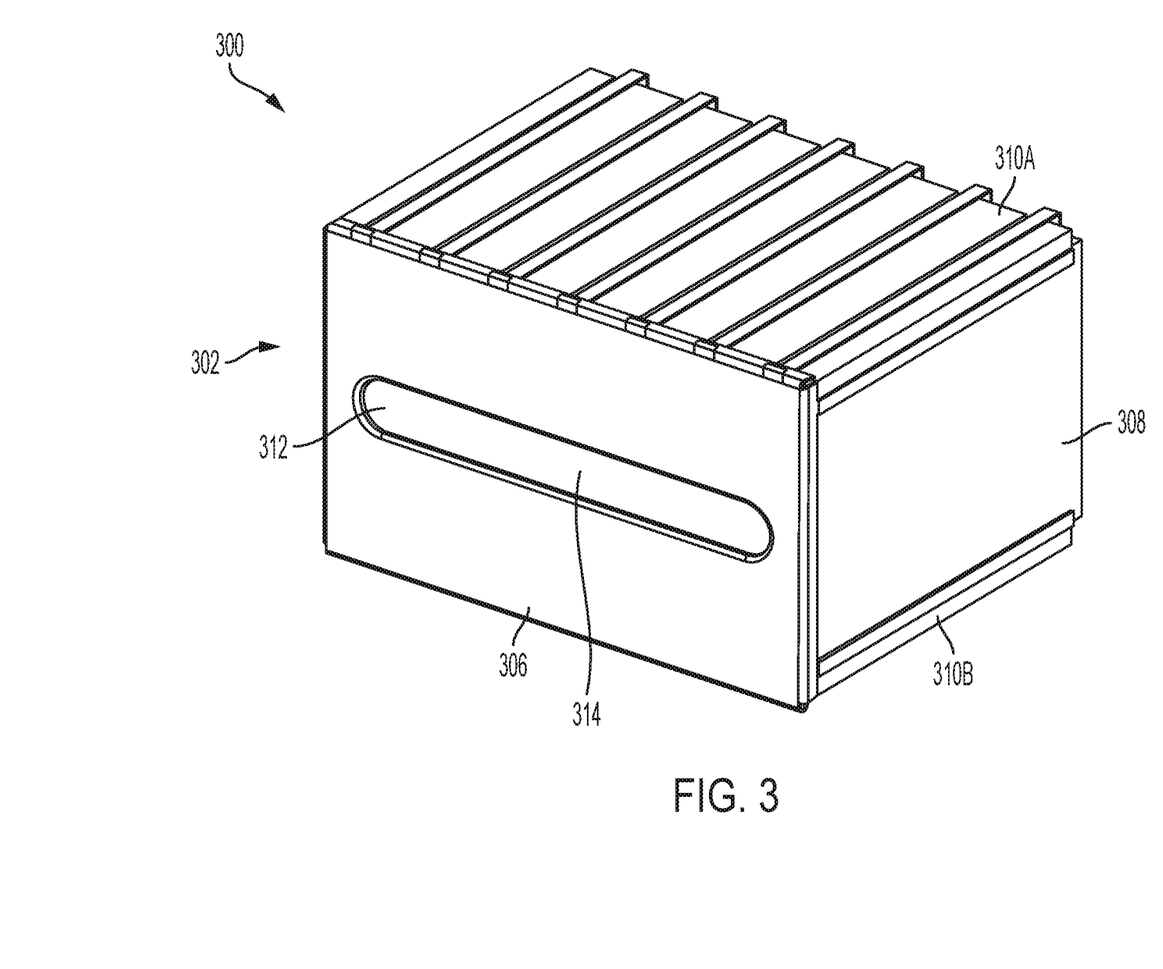
FIG. 3 shows a perspective view of a retention assembly, in accordance with certain embodiments of the present disclosure.
Figure 4:
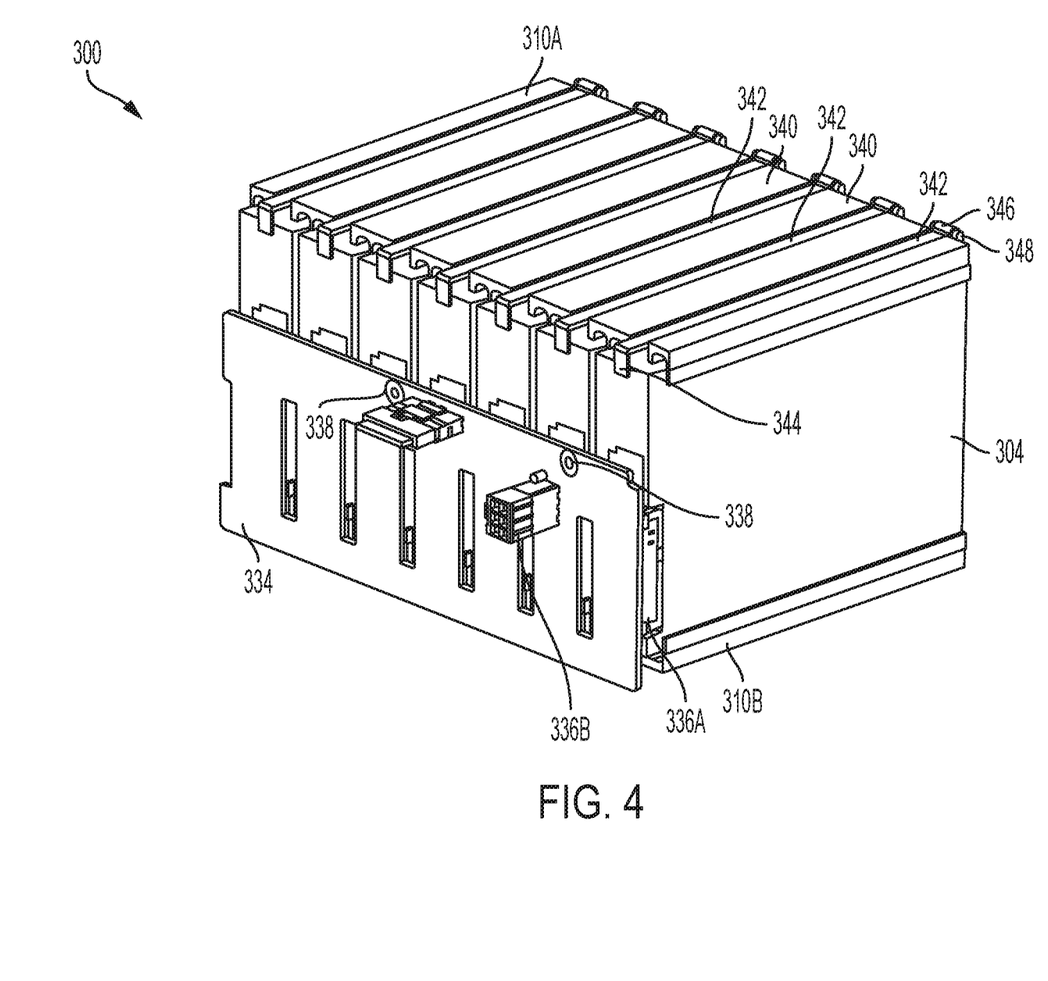
FIG. 4 shows a perspective view of a portion of the retention assembly of FIG. 3, in accordance with certain embodiments of the present disclosure.
Figure 5:
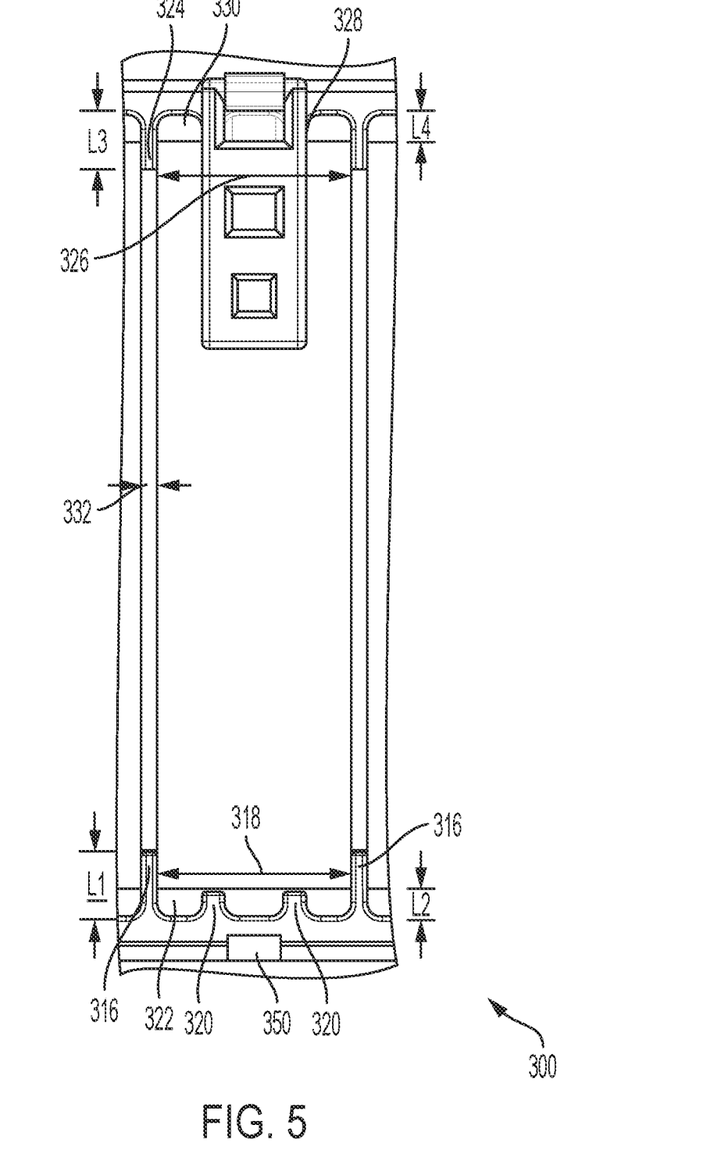
FIG. 5 shows a partial front view of the retention assembly of FIGS. 3 and 4, in accordance with certain embodiments of the present disclosure.
Figure 7:
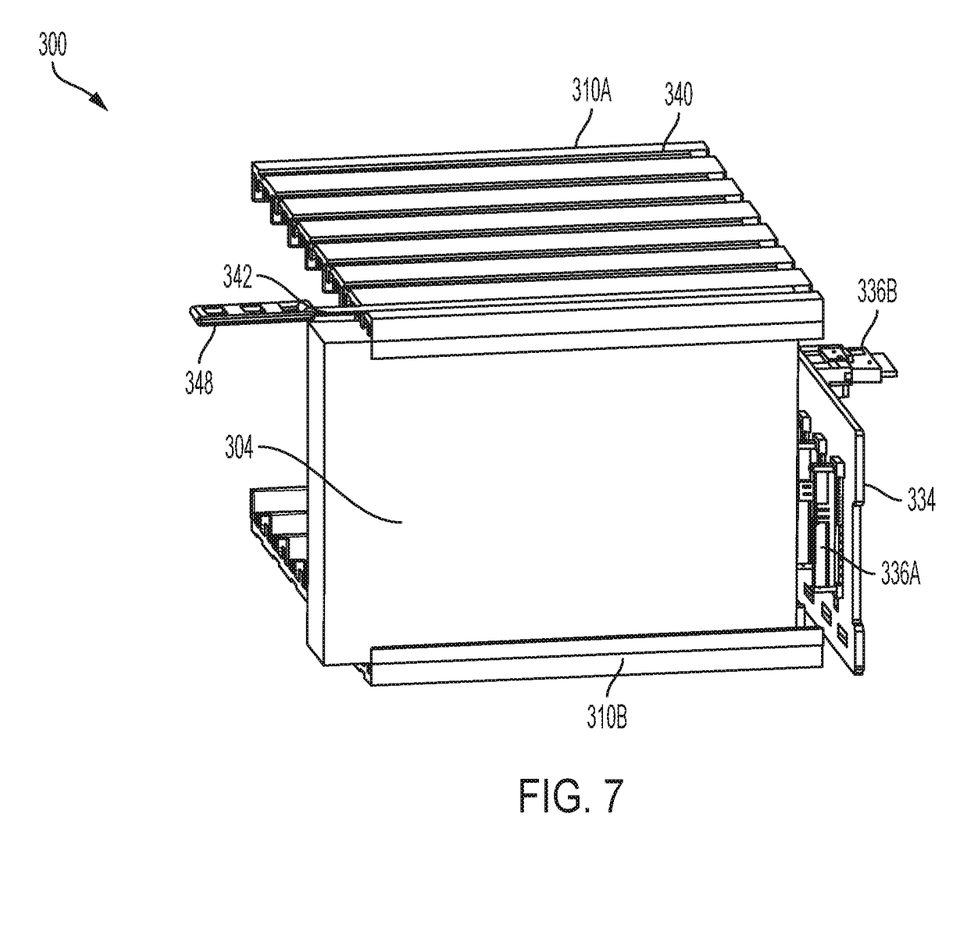
FIG. 7 shows a partial view of the retention assembly of FIGS. 3-5, in accordance with certain embodiments of the present disclosure.

The retention assembly 300 includes a housing 302 (shown in FIG. 3), which can house data storage devices 304 (shown in FIGS. 4, 5, and 7). The housing 302 shown in FIG. 3 can include a front cover 306 and various walls (e.g., side wall 308, bottom wall, top wall, back wall) coupled to each other or integrally formed to create the housing 302. The front cover 306 can be removably coupled to a top retention member 310A and a bottom retention member 310B. In some embodiments, the top retention member 310A and the bottom retention member 310B form the top wall and the bottom wall, respectively, of the housing 302. In other embodiments, the top retention member 310A and the bottom retention member 310B are positioned within the housing 302 and coupled to the top wall and the bottom wall of the housing 302. For example, the housing 302 can form a box-like structure (e.g., a metal wrap) in which the the top retention member 310A, the bottom retention member 310B, and the data storage devices 304 are positioned.

In certain embodiments, the front cover 306 is arranged to pivot (similar to an oven door on an oven) to expose an internal cavity of the retention assembly 300. In certain embodiments, the front cover 306 and side walls 308 are perforated or otherwise structured to allow air to flow through the side walls 308 and the retention assembly 300 such that the air passes across and between the data storage devices 304. In certain embodiments, the front cover 306 includes a recess 312 in which a damper 314 is positioned. When the front cover 306 is shut, the damper 314 is coupled between the front cover 306 and the data storage devices 304. The damper 314 helps retain the data storage devices 304 in the retention assembly 300 as well as dampen vibrations transmitted between the front cover 306 and the data storage devices 304.

Figure 6:
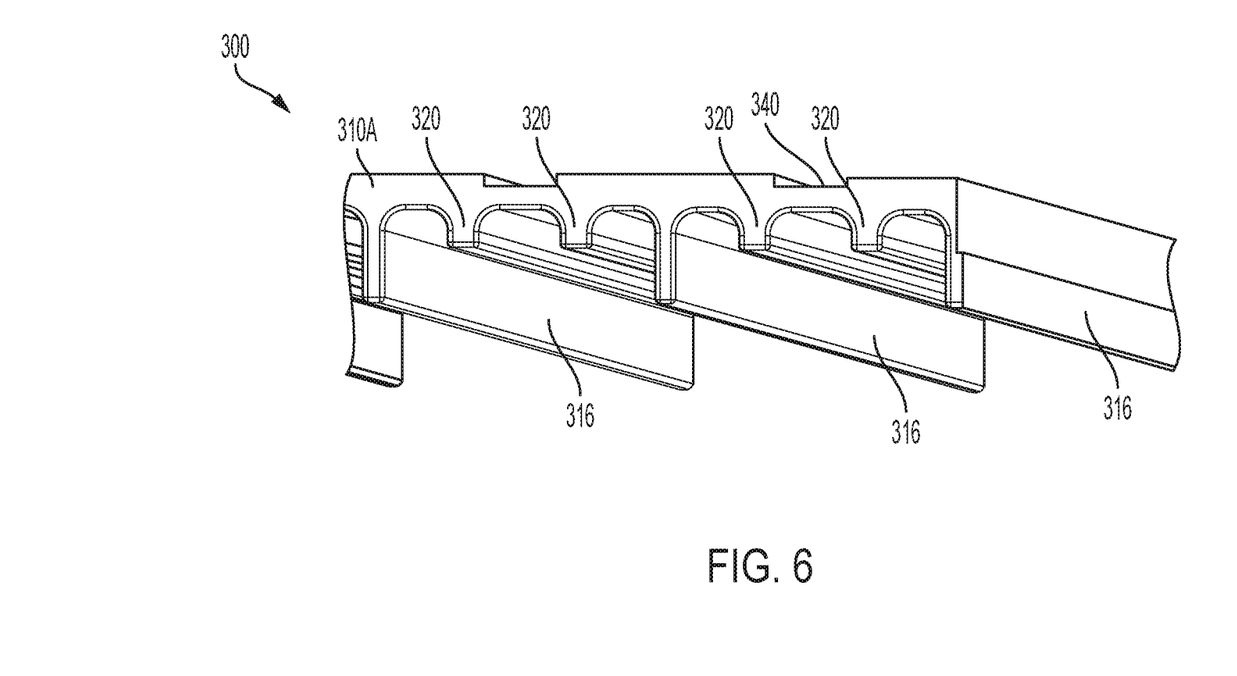
FIG. 6 shows a partial perspective view of a retention member of the retention assembly of FIGS. 3-5, in accordance with certain embodiments of the present disclosure.

FIGS. 4-7 show aspects of the retention assembly 300 without the housing 302 shown in FIG. 3. FIGS. 4 and 5 shows different aspects of how the data storage devices 304 are secured within the retention assembly 300 between the top retention member 310A and the bottom retention member 310B. FIG. 6 shows additional features of the top retention member 310A, and FIG. 7 shows aspects of how the data storage devices 304 are installed in and removed from the retention assembly 300.

As shown in FIG. 4, the data storage devices 304 are secured within the retention assembly 300 between the top retention member 310A and the bottom retention member 310B. FIGS. 5 and 6 show the top retention member 310A including a first set of ribs 316. The ribs 316 in the first set of ribs are positioned with respect to each other to form slots 318, which are shaped to receive one of the data storage devices 304. The ribs 316 are arranged to separate adjacent data storage devices 304, as shown in FIG. 5. The ribs 316 have a length ($L_1$) such that the ribs 316 at least partially extend between the data storage devices 304.

The top retention member 310A also includes a second set of ribs 320, as best seen in FIG. 6. The ribs in the second set of ribs 320 have a length ($L_2$) such that the ribs 320 extend into one of the slots 318 formed by the first set of ribs 316. In certain embodiments, the length ($L_1$) of the first set of ribs 316 is less than the length ($L_2$) of the second set of ribs 320.

The second set of ribs 320 are shaped so that, when a respective data storage device 304 is positioned within the slot 318, there are one or more channels 322 within the slots 318. The channels 322 allow air to pass over the data storage devices 304 secured within the retention assembly 300.

FIG. 5 shows the bottom retention member 310B including a third set of ribs 324. The ribs 324 in the third set of ribs are positioned with respect to each other to form additional slots 326, which are shaped to receive one of the data storage devices 304. The ribs 324 are arranged to separate adjacent data storage devices 304, as shown in FIG. 5. The ribs 324 have a length ($L_3$) such that the ribs 324 at least partially extend between the data storage devices 304.

The bottom retention member 310B also includes a fourth set of ribs 328, similar to those shown for the top retention member 310A shown in FIG. 6. The fourth set of ribs 328 has a length ($L_4$) such that the ribs 328 extend into one of the slots 326 formed by the third set of ribs 324. In certain embodiments, the length ($L_3$) of the third set of ribs 324 is less than the length ($L_4$) of the fourth set of ribs 328. The fourth set of ribs 328 is shaped so that, when a respective data storage device 304 is positioned within the slot 326, there are one or more channels 330 within the slots 326. The channels 330 allow air to pass over the data storage devices 304 secured within the retention assembly 300.

As shown in FIG. 5, when the data storage devices 304 are secured within the retention assembly 300, the first set of ribs 316 and the third set of ribs 324 help provide a gap 332 between the data storage devices 304. Air pulled by air movers in the data storage system can pass through the gap 332 to help cool the data storage devices 304, and air can also pass through the channels 322 and 330 to also help cool the data storage devices 304. As such, air can be passed across each side (e.g., all six sides) of the data storage devices 304. Further, a larger amount of surface area of the data storage devices is exposed to air flow compared to the amount of exposed surface area when data storage devices are secured within individual carriers. In addition, because carriers typically act as thermal insulators, cooling is improved using the retention assembly 300 compared to carrier-based approaches. In certain embodiments, the data storage devices 304 are bare hard disk drives that are not positioned in individual carriers so that the air passes over the hard disk drives.

Further, various members of the retention assembly 300 such as the top retention member 310A and the bottom retention member 310B comprise a dampening material (e.g., elastomer). The dampening material can dampen the amount of vibration transferred to the data storage devices 304 positioned within the retention assembly 300. For example, the dampening material can help dampen vibration generated by the data storage devices 304 themselves and can help dampen vibration generated externally from the retention assembly 300. In certain embodiments, the retention assembly 300 includes a dampening material at each contact point between the data storage devices 304 and the retention assembly 300. For example, to the extent a surface of the data storage devices 304 contacts a component or member of the retention assembly 300, that contact point can comprise a dampening material.

Moving back to FIG. 4, the retention assembly 300 includes a backplane circuit board 334. The backplane circuit board 334 includes electrical connectors 336A that mechanically and electrically couple to the data storage devices 304 to power the data storage devices 304 and to transfer data to and from the data storage devices 304. The backplane circuit board 334 includes another set of electrical connectors 336B that couple to cables, etc., to transfer power and data to the backplane circuit board 334 (and therefore the data storage devices 304). The backplane circuit board 334 can be mounted to the housing 302 via one or more dampers 338 (e.g., dampers comprising an elastomer). The dampers 338 dampen vibration that would otherwise transfer to the data storage devices 304 via the backplane circuit board 334. The dampers 338 enable the backplane circuit board 334 to "float" with the housing 302 so that the backplane circuit board 334 is not rigidly coupled to the housing 302. For example, the dampers 338 allow the backplane circuit board 334 and the housing 302 to move independently of each other, which reduces the amount of vibration that is transferred between the two.

The retention assembly 300 can include features for helping a user install, secure, and remove the data storage devices 304. As shown in FIGS. 3, 4, and 7, the top retention member 310A includes multiple extractor slots 340 positioned on an opposite side of the top retention member 310A than the first set of ribs 316. In the embodiments shown, the top retention member 310A includes an extractor slot 340 for each data storage device 304. The extractor slots 340 are shaped to permit an extractor 342 shown in FIGS. 4 and 7 to extend into the extractor slot 340 and slide within the extractor slot 340. The extractor 342 is used to install, secure, and remove the data storage devices 304 from the retention assembly 300.

FIG. 4 shows the extractors 342 helping to secure the data storage devices 304. Each extractor 342 includes a back portion 344 that extends towards the respective data storage device 304 and that couples to a back side of the data storage device 304. A front portion 346 of the extractor 342 includes a lift tab 348 (best seen in FIG. 7) that can be rotated or flipped up to allow a data storage device 304 to be slid into the slots 318, 326 formed by the top retention member 310A and the bottom retention member 310B. The data storage device 304 can then be mechanically and electrically coupled to the electrical connectors 336A of the backplane circuit board 334. For example, a user can push the data storage devices 304 within the slots 318, 326, which guide the data storage devices 304 towards the electrical connectors 336A.

Once the data storage devices 304 are installed (e.g., mechanically and electrically coupled to the electrical connectors 336A), the lift tab 348 can be pivoted down so that the retention assembly 300 can be closed (e.g., the front cover 306 can be closed) and installed into an enclosure. To remove the data storage devices 304 from the retention assembly 300, the extractor 342 can be pulled (e.g., pulled via the lift tab 348) such that the extractor 342 (and therefore the respective data storage device 304) can be pulled away from the electrical connector 336A, the top retention member 310A, and the bottom retention member 310B. In certain embodiments, top retention member 310A includes an open space near a back portion of the extractor slot 340 such that the back portion 344 of the extractor 342 can be pulled into the open space to partially pull the data storage devices 304 from the retention assembly 300. FIG. 7 shows one of the data storage devices 304 partially pulled out from the retention assembly 300 such that a user can then grasp the data storage device 304 with their fingers to completely remove the data storage device from the retention assembly 300.

In certain embodiments, one or both of the top retention member 310A and the bottom retention member 310B includes one or more optical elements 350 (e.g., optical fiber), shown in FIG. 5, embedded in the respective member. The optical elements 350 can be optically coupled to LEDs (not shown) on the backplane circuit board 334. The LEDs can emit one or more colors indicating a status (e.g., fault, active) of respective data storage devices 304. The optical element 350 can pass the emitted light through the top and bottom retention members 310A and 310B such that the light emitted by the LED can be transmitted (e.g., piped) towards the front of the retention assembly 300 so that a user can easily see the status of the data storage devices 304.

As described above, the retention assembly 300 helps expose surface area of data storage devices to air moved within an enclosure for a data storage system. This can result in better cooling of the data storage devices compared to carrier-based approaches. With better cooling, higher-powered data storage devices can be used within a given enclosure design and/or the cooling system can operate at a lower power setting to save cost and power consumption. Further, the retention assembly helps reduce the amount of vibration that the data storage devices are subjected to. For a hard disk drive, vibration makes it difficult for the read/write heads in the hard disk drives to settle on or follow a desired data track during data reading and data writing operations. Reducing vibration can improve performance and reduce errors.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

I claim:

1. A retention assembly comprising:
    a first retention member including a first set of ribs and a second set of ribs, the first set of ribs positioned to form a first part of slots, which are shaped to receive data storage devices, and arranged to separate adjacent data storage devices and having a first length, the second set of ribs extending into respective slots to form air channels within the slots and having a second length that is shorter than the first length; and
    a second retention member including a third set of ribs forming a second part of the slots for the data storage devices; and
    data storage devices positioned within the slots, wherein a first of the data storage devices is positioned in one of the slots between the first retention member and the second retention member, wherein a second of the data storage devices is positioned in another one of the slots between the first retention member and the second retention member.

2. The retention assembly of claim 1, wherein the second retention member includes a fourth set of ribs extending into respective slots to form additional air channels.

3. The retention assembly of claim 1, wherein the first retention member includes an embedded optical element.

4. The retention assembly of claim 1, wherein the first retention member includes an extractor slot positioned on an opposite side of the first set of ribs.

5. The retention assembly of claim 4, further comprising:
    an extractor shaped to extend into the extractor slot and slideable within the extractor slot.

6. The retention assembly of claim 1, further comprising:
a housing including walls that surround the first retention member and the second retention member.

7. The retention assembly of claim 6, wherein the first retention member and the second retention member are coupled to the housing.

8. The retention assembly of claim 6, wherein at least one of the walls is perforated.

9. The retention assembly of claim 1, further comprising:
a circuit board electrically coupled to the data storage devices.

10. The retention assembly of claim 9, wherein the circuit board is mechanically coupled to the housing via a damper.

11. The retention assembly of claim 1, wherein the first retention member comprises an elastomeric material.

12. The retention assembly of claim 1, wherein the data storage devices are bare hard disk drives.

13. The retention assembly of claim 1, further comprising:
data storage devices positioned immediately between the first retention member and the second retention member.

14. A system comprising:
an enclosure including a plurality of walls; and
a retention assembly positioned within the enclosure and including:
a housing,
data storage devices,
a first retention member with a first set of ribs and a second set of ribs, the first set of ribs positioned to form a first part of slots in which the data storage devices are positioned and arranged to separate adjacent data storage devices, the second set of ribs extending into respective slots to form air channels between the data storage devices and the first retention member, and
a second retention member with a third set of ribs forming a second part of the slots in which the data storages devices are positioned; and
a first of the data storage devices is positioned in one of the slots between the first retention member and the second retention member, wherein a second of the data storage devices is positioned in another one of the slots between the first retention member and the second retention member.

15. The system of claim 14, wherein the data storage devices are bare hard disk drives, wherein a surface area of each side of the data storage devices is exposed to air passing through the enclosure.

16. The system of claim 14, further comprising:
a circuit board electrically coupled to the data storage devices and mechanically coupled to the housing via a damper.

17. The retention assembly of claim 14, wherein the second retention member includes a fourth set of ribs extending into respective slots to form additional air channels.

18. The retention assembly of claim 14, wherein the second retention member comprises the elastomeric material.

* * * * *